United States Patent [19]
Sun et al.

[11] Patent Number: 5,930,584
[45] Date of Patent: Jul. 27, 1999

[54] PROCESS FOR FABRICATING LOW LEAKAGE CURRENT ELECTRODE FOR LPCVD TITANIUM OXIDE FILMS

[75] Inventors: Shi-Chung Sun, Taipei; Tsai-Fu Chen, Mit Village Kaoshiung Hsien, both of Taiwan

[73] Assignee: United Microelectronics Corp., Hsinchu, Taiwan

[21] Appl. No.: 08/640,085

[22] Filed: Apr. 30, 1996

[51] Int. Cl.⁶ .................................................. H01L 21/302
[52] U.S. Cl. ............................. 438/3; 438/240; 438/393; 438/396; 438/653; 438/656; 438/785
[58] Field of Search ..................................... 938/785, 396, 938/393, 653, 656, 3, 240

[56] References Cited

U.S. PATENT DOCUMENTS

| | | | |
|---|---|---|---|
| 5,189,503 | 2/1993 | Suguro | 257/310 |
| 5,418,388 | 5/1995 | Okudaira | 257/295 |
| 5,714,402 | 2/1998 | Choi | 437/60 |

*Primary Examiner*—D. Margaret M. Mach
*Attorney, Agent, or Firm*—Ladas & Parry

[57] ABSTRACT

A process for fabricating electrodes for the capacitor dielectric of semiconductor memory devices with low leakage current characteristics is disclosed. The process comprises the steps of first depositing a titanium oxide film over a semiconductor silicon substrate. The deposited titanium oxide film is then annealed. A layer of tungsten nitride top electrode is then deposited on the annealed titanium oxide film. A second annealing procedure is then conducted to simulate post electrode high temperature process.

23 Claims, 6 Drawing Sheets

PROCESS FOR FABRICATING LOW LEAKAGE CURRENT ELECTRODE FOR LPCVD TITANIUM OXIDE FILMS

BACKGROUND OF THE INVENTION

1. Field of the Invention

The present invention relates in general to a process for fabricating electrodes for the capacitor dielectric of semiconductor memory devices, and in particular, to a process for fabricating low leakage current electrodes for capacitor storage dielectric of high-density semiconductor memory devices. More particularly, the present invention relates to a process for fabricating electrodes of storage dielectrics for high-density semiconductor memory devices having good capacitance and leakage current characteristics realized at low pressure in a cold wall reactor.

2. Technical Background

High-density semiconductor memory devices, especially DRAM devices, are being developed to the giga-bits per device level. Dielectric storage materials utilized in present-day mega-bit memory devices employing the current material technology in device fabrication will not carry these memory devices to storage densities higher than about 256M per device. This is primarily due to the limitation of the memory cell charge density they can hold and sustain for a reasonable period of time before requiring refreshing.

Among the materials considered for the storage dielectrics in the next generation of giga-bit memory devices, chemical vapor deposited $TiO_2$ films appear to be promising due to their inherent high permittivity and excellent step coverage characteristics. One serious problem, however, in utilizing these high dielectric constant storage materials is the high leakage current when they are implemented in the storage dielectrics utilizing the current technology. Until now, however, very little attention has been paid to the techniques used to reduce the leakage current in $TiO_2$ thus preventing the use of $TiO_2$ as a successful storage dielectric in the high-density memory devices. Systematic characterization of electrical properties of low-pressure chemical vapor deposited $TiO_2$ treated under different electrode materials is effectively unavailable at this stage.

SUMMARY OF THE INVENTION

It is therefore the primary object of the present invention to provide a process for fabricating electrodes for capacitor dielectrics of semiconductor memory devices having low leakage current characteristics.

It is another object of the present invention to provide a process for fabricating in low pressure environment capacitor dielectrics of semiconductor memory devices having low leakage current characteristics.

It is yet another object of the present invention to provide a process for fabricating with low cost the electrodes for capacitor dielectrics of semiconductor memory devices having low leakage current characteristics.

To achieve the above-identified objects, the present invention provides a process for fabricating electrodes for capacitor dielectrics of semiconductor memory devices with low leakage current characteristics. The process comprises the steps of first depositing a titanium oxide film over a semiconductor silicon substrate. The deposited titanium oxide film is then annealed. A layer of top electrode is then deposited on the annealed titanium oxide film. A second annealing procedure is then conducted. This step in the present invention is to simulate the high temperature process used in the borophosilicate glass (BPSG) densification or contact reflow commonly encountered in the manufacturing environment.

BRIEF DESCRIPTION OF THE DRAWING

Other objects and features of the present invention are described with reference to the preferred embodiments exemplified below with the accompanying drawing in which FIGS. 1a–1c schematically show the cross-sectional views of the storage dielectrics of the memory device together with the electrode thereof being fabricated in accordance with a preferred embodiment of the present invention as depicted from the selected process stages respectively.

DETAILED DESCRIPTION OF THE PREFERRED EMBODIMENT

To provide for fabricating electrodes for capacitor dielectrics of semiconductor memory devices having low leakage current characteristics, the process of the present invention is exemplified in a preferred embodiment as described in the following paragraphs. Note that the dimensions in the FIGS. 1a–1c are not drawn to the exact scale as they only schematically depict the cross-sectional views of the device being fabricated.

Step 1

Prepare a semiconductor silicon substrate as the basis for the fabrication of a high-density memory device utilizing the $TiO_2$ film as its memory cell capacitor dielectric layer.

Figure 1A:
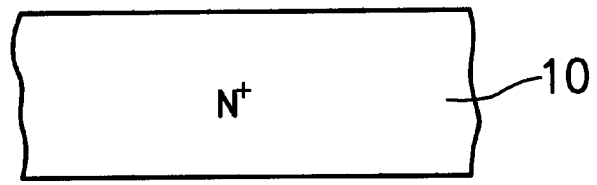
Figure 1B:
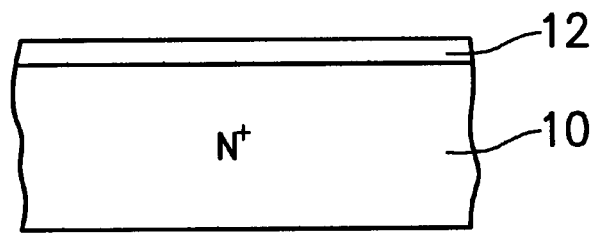
Figure 1C:
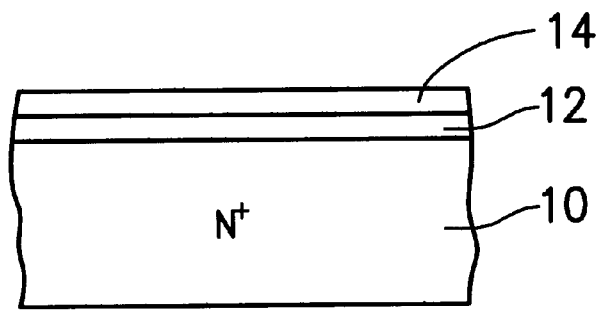

As is seen in FIG. 1a, the substrate 10 may, for example, be an $n^+$ type silicon (Si) substrate, or an $n^+$ polysilicon (poly-Si) substrate that may serve as the bottom electrode of the memory cell capacitor for the fabricated memory device.

Step 2

Deposit a $TiO_2$ film over the semiconductor silicon substrate.

In FIG. 1b, the $TiO_2$ film 12 may be seen deposited in, for example, a cold-wall low-pressure chemical vapor deposition (LPCVD) reactor on the $n^+$ type Si substrate or the $n^+$ poly-Si substrate 10 that serves as the bottom electrode of the memory cell capacitor. The thin $TiO_2$ film 12 with a thickness of about 10 to 20 nm may be deposited at a temperature of about 350° C., using tetra-isopropyl-titanate (TPT, $Ti(i.OC_3H_7)_4$) vapor and oxygen as the ambient atmosphere.

Step 3

Subject the deposited $TiO_2$ film to an annealing procedure.

The thermal annealing procedure of the deposited $TiO_2$ film 12 may be conducted in a dry $O_2$ atmosphere, for example, at about 800° C. for about 30 minutes.

Step 4

Deposit a layer of top electrode on the $TiO_2$ film so as to overlie said film.

Top electrode for the capacitor dielectric layer, namely, the layer of top electrode 14 as is seen in FIG. 1c may be deposited on the TiO$_2$ film 12 by, for example, the method of reactive sputtering, electron beam or chemical vapor deposition (CVD). The deposition material for the top electrode 14 may include several metals and metal nitrides. For example, metals such as tungsten (W) and molybdenum (Mo), and metal nitrides such as tungsten nitride (WN), titanium nitride (TiN) and tantalum nitride (TaN) may be used as the material for top electrodes.

Step 5

Conduct an annealing procedure.

An annealing procedure is then conducted against the semiconductor device carried over the surface of the silicon substrate 10 of FIG. 1c at this stage. The annealing may be implemented in an N$_2$ environment for about 30 minutes at the temperature of about 400–800° C. It should be noted that this annealing procedure is conducted to simulate the high temperature process used, for example, in the borophosilicate glass (BPSG) densification or contact reflow commonly encountered in the manufacturing environment.

The above-described procedural steps comprise the process of the present invention for fabricating the low leakage current electrode for the LPCVD TiO$_2$ capacitor storage dielectrics in high-density semiconductor memory devices. In order to demonstrate the effects of annealing after deposition of the top electrode 14 of FIG. 1c as outlined in the above step 4, samples of different materials as mentioned above of top electrode 14 are annealed in N$_2$ for 30 min at 450° C. and 800° C. Electrical characteristics of the TiO$_2$ layers are measured by I-V, and C-V methods.

Figure 2:
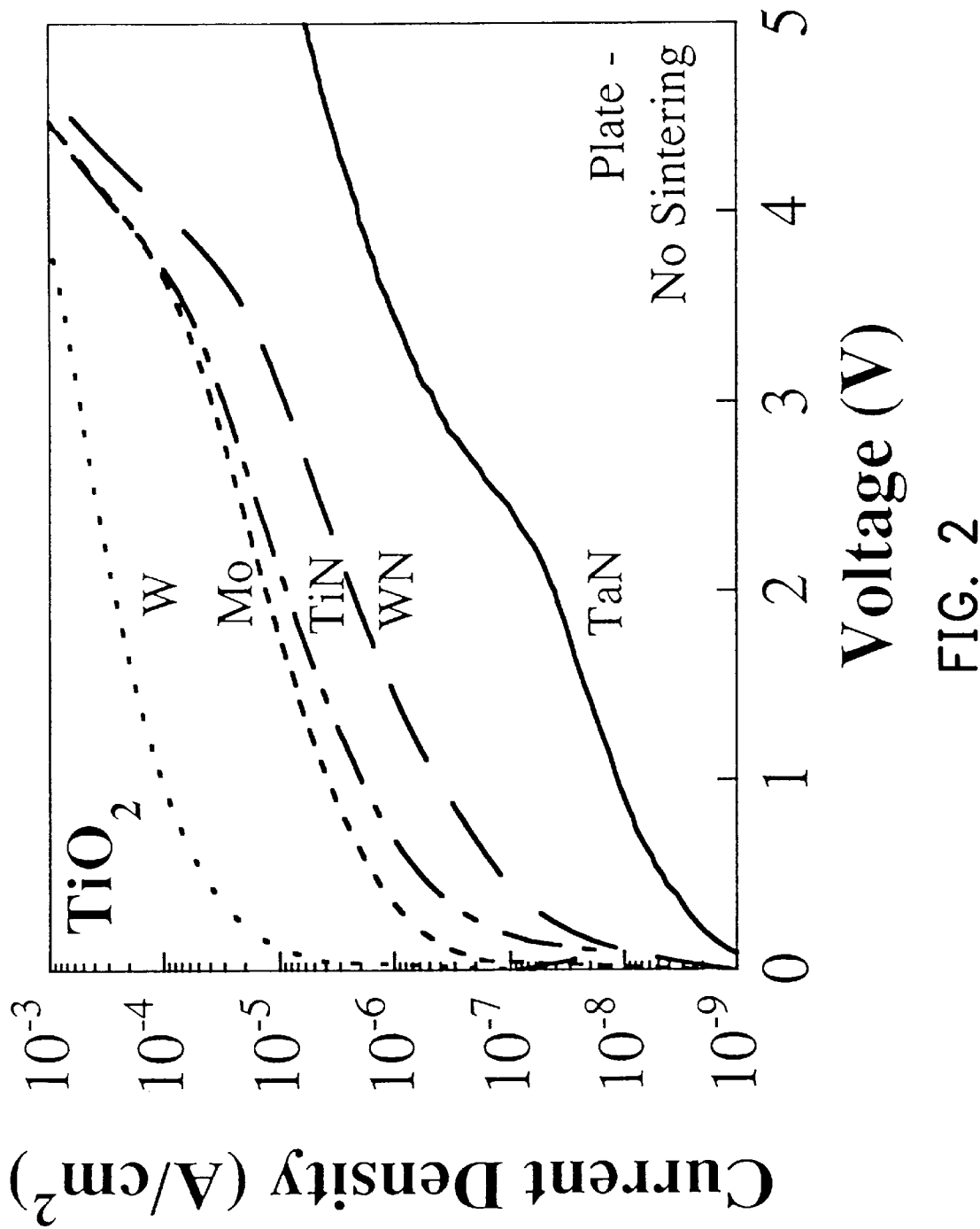
FIG. 2 shows the leakage current characteristics of CVD—$TiO_2$ capacitors with various electrode materials before annealing.

FIG. 2 shows the leakage current characteristics of TiO$_2$ semiconductor memory cell capacitors with several different electrode materials before being annealed in the above-described step 5. The electrodes of these device samples include those fabricated utilizing materials of W, Mo, TiN, WN, and TaN respectively, as is seen in the drawing. Negative bias is applied to the top electrode of these capacitors. Before annealing, leakage currents of capacitors with nitride electrodes are smaller than those with metal ones, in particular, in the case of TaN electrode, a minimum leakage is obtained. The reason for using negative bias for the measurement of leakage current is due to the fact that electrons are injected from the electrode when negatively biased and the effect of electrode material selection over leakage current can be verified.

Figure 3:
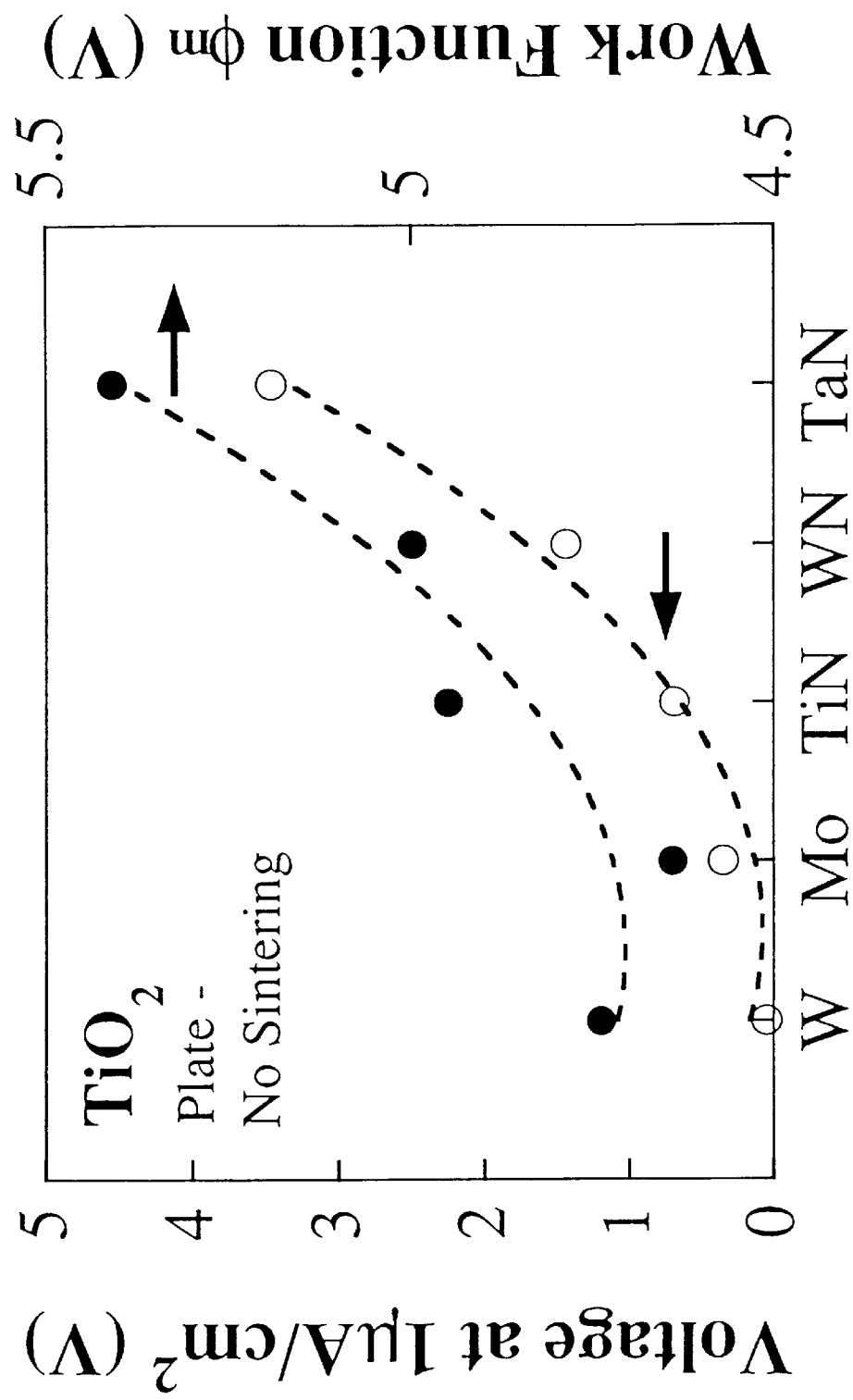
FIG. 3 shows the relationship between the $V_{crit}$, work function and electrode materials before annealing.

In order to verify the effects of electrode materials on the leakage current, V$_{crit}$, the voltage which induces a leakage current of 1 $\mu$A/cm$^2$ and the work function ($\Phi$m) of the electrode before sintering are plotted for several different electrodes shown in FIG. 3. Before sintering, $\Phi$m of TaN, TiN, WN, W, and Mo are 5.41, 4.95, 5.00, 4.75, and 4.64 V, respectively. It is found that, in most electrode materials, V$_{crit}$ increases with increasing $\Phi$m before sintering.

Figure 4:
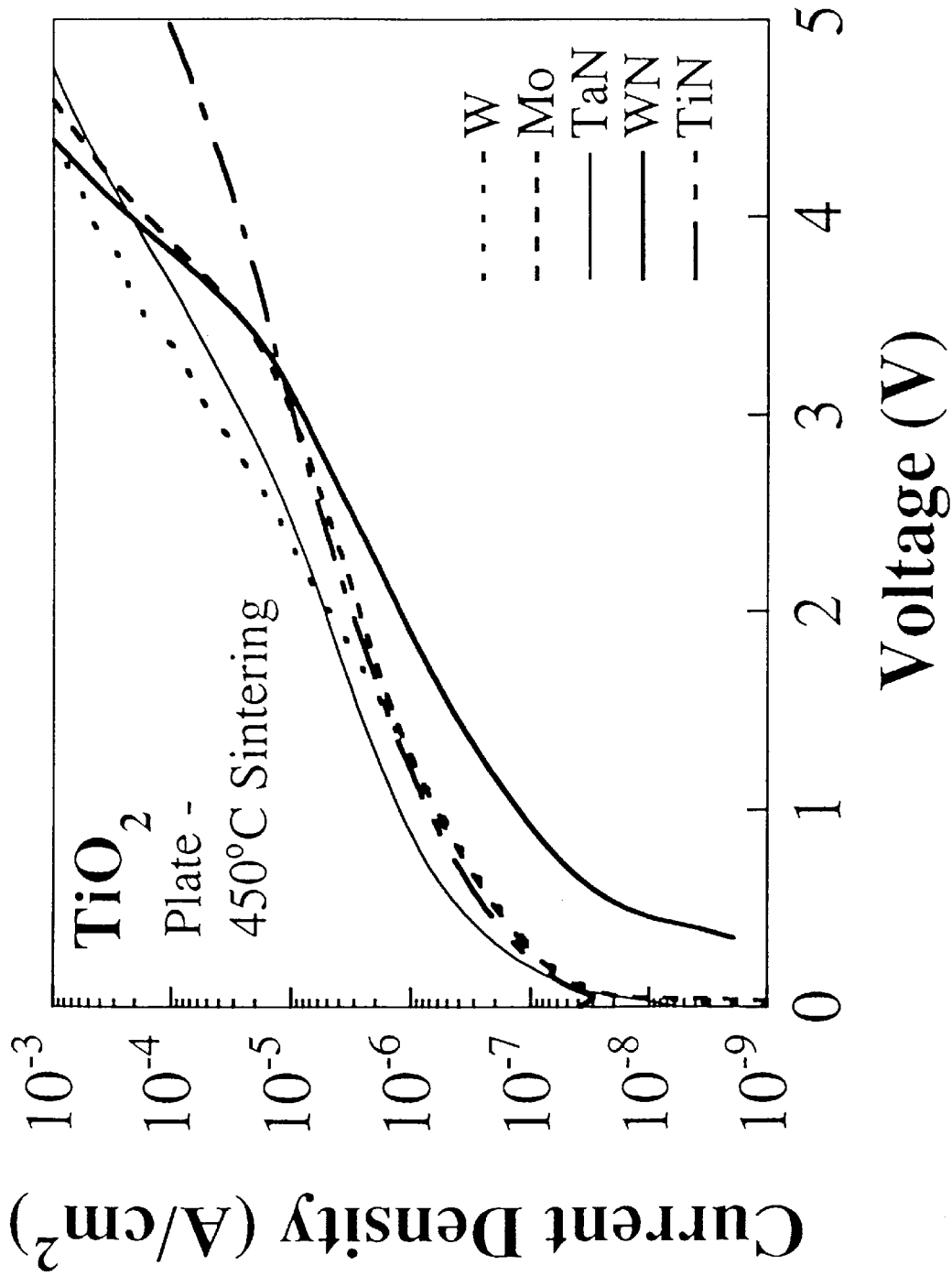
FIG. 4 shows the leakage current characteristics of the $TiO_2$ capacitors of FIG. 2 after 450° C. annealing.
Figure 6:
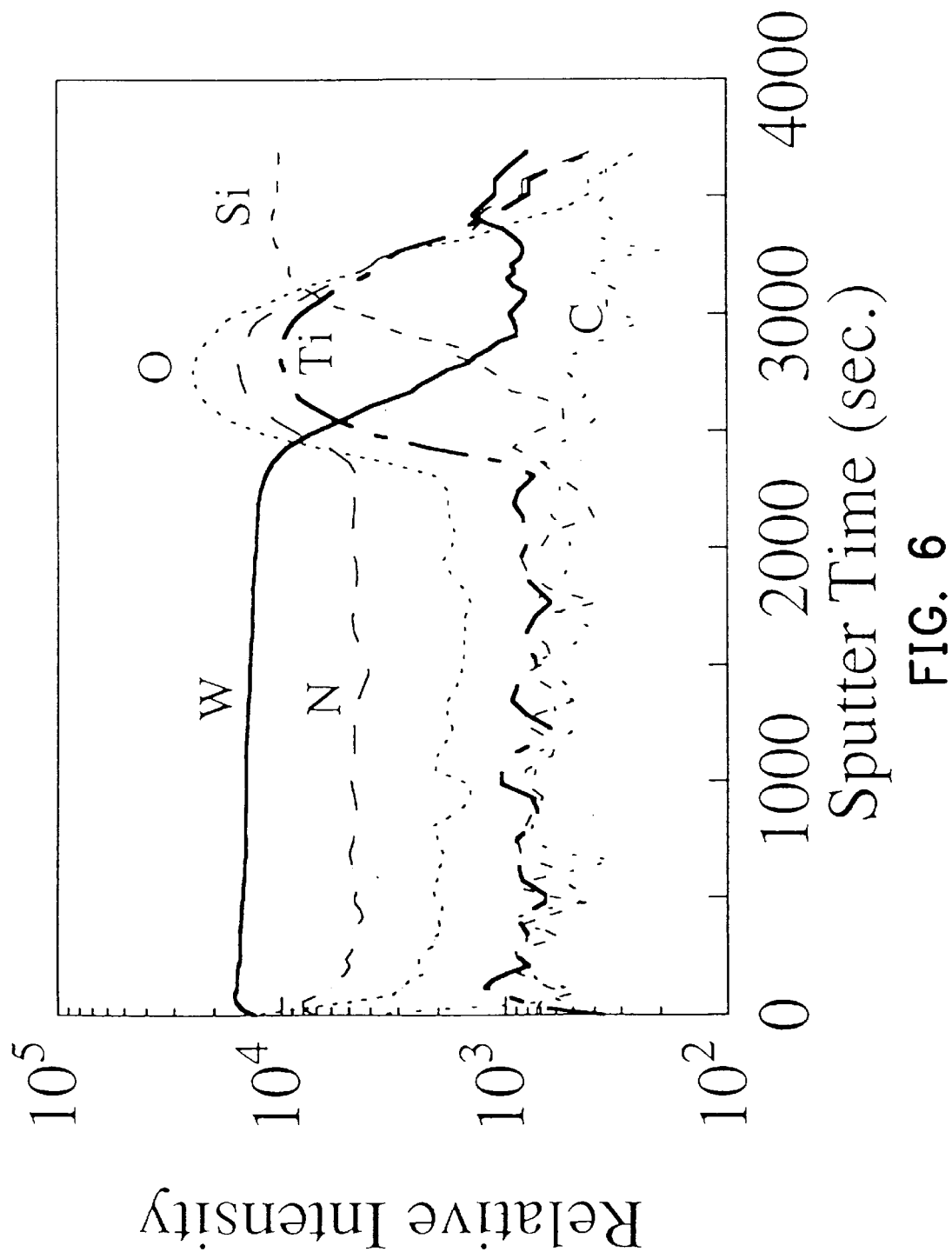
FIG. 6 shows the Secondary Ion Mass Spectroscopy (SIMS) depth profiles of the WN/CVD—$TiO_2$/Si capacitors after annealing.

In other words, the leakage current decreases with increasing $\Phi$m of the electrode. This is why TaN resultes in the lowest leakage current. These results indicate that the conduction mechanism in the case of negative bias is an electrode-limited type, and the energy barrier height for electrons at the top electrode/TiO$_2$ interface limits the leakage current. FIG. 4 shows the leakage current characteristics after annealing at a temperature of about 450° C. in the case of negative bias applying to the top electrode. When compared with the situation before the annealing procedure, all electrode materials in FIG. 4 are shown characterized with vast differences in leakage current behavior. This is because the top electrode work function has a diminished influence on the leakage current. A comparison reveals the fact that capacitor with WN top electrode features the smallest leakage current. This is because WN has a better thermal stability than TaN, for example, and is able to sustain high temperature with virtually no dissociation. After the 450° C. sintering procedure, substantially no reaction or mutual diffusion occurs between the WN top electrode and the TiO$_2$ layer therebelow, which allows for the lower leakage current. FIG. 6 confirms this fact, wherein WN and TiO$_2$ remained intact after the 450° C. sintering procedure.

Figure 5:
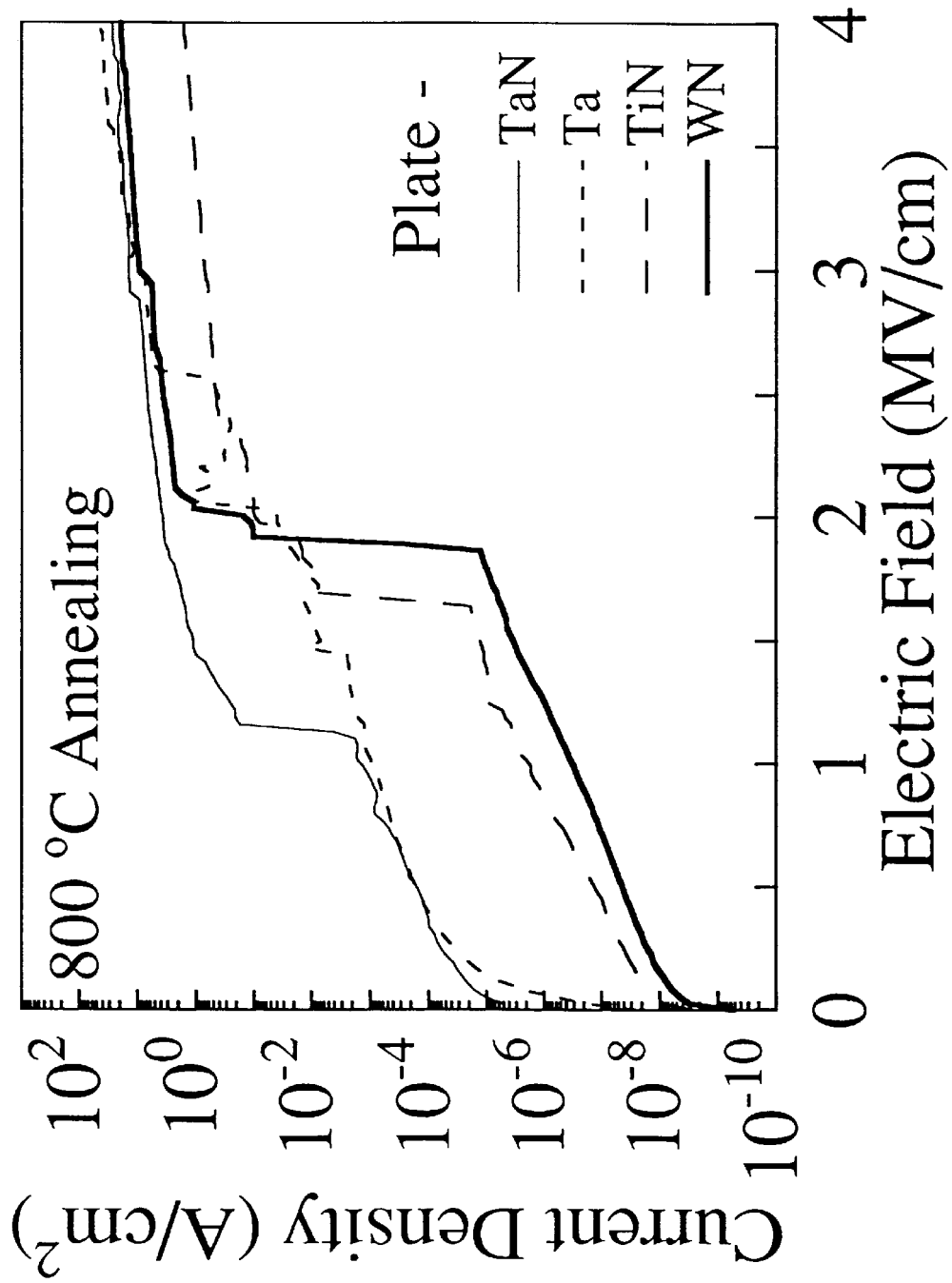
FIG. 5 shows the leakage current characteristics of the $TiO_2$ capacitors of FIG. 2 after 800° C. annealing.

FIG. 5 shows the leakage current characteristics after annealing at a temperature of about 800° C. with the top electrode negatively biased. It confirms the results of FIG. 4, that the capacitor utilizing tungsten nitride (WN) top electrode has the lowest leakage current.

The examination to the above-described TiO$_2$ capacitor samples has shown that the work function of the top electrode material determines the electrical characteristics of a TiO$_2$ capacitor before sintering, and material with large work function, for example, TaN, has the lowest leakage. After 450° C. sintering, the reaction between TiO$_2$ and the top electrode reduces the work function difference among various materials, therefore the electrode effect is diminished. Thermal stability of the employed electrode material is a more important factor at this stage, and the WN electrode capacitors exhibit the smallest leakage current.

Thus, the present invention has been able to demonstrate that the annealing procedure in N$_2$ for the TiO$_2$ capacitor with its top electrode formed can assist in unifying the electrode leakage current characteristics for various metal and metal nitride electrode materials. A process for the fabrication of low leakage current electrode for high-density memory cell capacitor is therefore possible in accordance with the disclosure of the present invention.

While the present invention has been described by way of example and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating electrodes for capacitor dielectrics of semiconductor memory devices having low leakage current characteristics, said process comprising the steps of:

preparing a semiconductor silicon substrate;

depositing a titanium oxide film, the film being substantially free of dissimilar metals, over said semiconductor silicon substrate;

annealing said deposited titanium oxide film;

depositing a layer of top electrode on said annealed titanium oxide film so as to overlie said film; and subjecting a high temperature environment.

2. The process of claim 1, wherein said semiconductor silicon substrate is an n$^+$ type silicon substrate, or an n$^+$ type polysilicon substrate.

3. The process of claim 1, wherein said titanium oxide film is TiO$_2$ film.

4. The process of claim 3, wherein said TiO$_2$ film has a thickness of about 10 to 20 nm.

5. The process of claim 4, wherein said TiO$_2$ film is deposited in a cold-wall low-pressure chemical vapor deposition (LPCVD) reactor.

6. The process of claim 5, wherein said $TiO_2$ film is deposited using tetra-isopropyl-titanate (TPT, $Ti(i.OC_3H_7)_4$) vapor and oxygen as the ambient atmosphere.

7. The process of claim 6, wherein said $TiO_2$ film is deposited at a temperature of about 350° C.

8. The process of claim 3, wherein said annealing of said deposited $TiO_2$ film is conducted in a dry $O_2$ atmosphere.

9. The process of claim 8, wherein said annealing of said deposited $TiO_2$ film is conducted at a temperature of about 800° C.

10. The process of claim 9, wherein said annealing of said deposited $TiO_2$ film is conducted for about 30 minutes.

11. The process of claim 3, wherein said top electrode layer is deposited on said $TiO_2$ film by a reactive sputtering method.

12. The process of claim 3, wherein said top electrode layer is deposited on said $TiO_2$ film by an electron beaming method.

13. The process of claim 3, wherein said top electrode layer is deposited on said $TiO_2$ film by a chemical vapor deposition (CVD) method.

14. The process of claim 3, wherein said top electrode layer is deposited on said $TiO_2$ film by a reactive sputtering method, and said top electrode layer is deposited utilizing a metal nitride material.

15. The process of claim 14, wherein said metal nitride material is tungsten nitride.

16. The process of claim 3, wherein said top electrode layer is deposited on said $TiO_2$ film by an electron beaming method, and said top electrode layer is deposited utilizing a metal nitride material.

17. The process of claim 16, wherein said metal nitride material is tungsten nitride.

18. The process of claim 3, wherein said top electrode layer is deposited on said $TiO_2$ film by a chemical vapor deposition method, and said top electrode layer is deposited utilizing a metal nitride material.

19. The process of claim 18, wherein said metal nitride material is tungsten nitride.

20. The process of claim 1, wherein the step of subjecting said high temperature environment is in an $N_2$ atmosphere.

21. The process of claim 20, wherein said high temperature environment is a t a temperature of about 400–800° C.

22. The process of claim 21, wherein the step of subjecting said high temperature environment is conducted for about 30 minutes.

23. A process for fabricating electrodes for capacitor dielectrics of semiconductor memory devices having low leakage current characteristics, said process comprising the steps of:

preparing a semiconductor silicon substrate;

depositing a titanium oxide film, the film being substantially free of dissimilar metals, over said semiconductor silicon substrate;

annealing said deposited titanium oxide film;

depositing a layer of tungsten nitride top electrode on said annealed titanium oxide film so as to overlie said film; and subjecting a high temperature of about 400–800° C. in an $N_2$ environment for about 30 minutes.

* * * * *